(12) United States Patent
Campos

(10) Patent No.: US 12,308,347 B2
(45) Date of Patent: May 20, 2025

(54) INTERCONNECTED STACKED CIRCUITS

(71) Applicant: STMicroelectronics (Grenoble 2) SAS, Grenoble (FR)

(72) Inventor: Didier Campos, Charavines (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 337 days.

(21) Appl. No.: 17/718,145

(22) Filed: Apr. 11, 2022

(65) Prior Publication Data
US 2022/0238492 A1 Jul. 28, 2022

Related U.S. Application Data

(62) Division of application No. 16/818,792, filed on Mar. 13, 2020, now Pat. No. 11,302,672.

(30) Foreign Application Priority Data

Mar. 19, 2019 (FR) ...................................... 1902807

(51) Int. Cl.
| | | |
|---|---|---|
| H01L 25/065 | (2023.01) | |
| H01L 21/56 | (2006.01) | |
| H01L 21/768 | (2006.01) | |
| H01L 23/00 | (2006.01) | |
| H01L 23/31 | (2006.01) | |

(52) U.S. Cl.
CPC .......... H01L 25/0657 (2013.01); H01L 21/56 (2013.01); H01L 21/76802 (2013.01); H01L 23/3128 (2013.01); H01L 24/13 (2013.01); H01L 24/81 (2013.01)

(58) Field of Classification Search
CPC ................. H01L 25/0657; H01L 21/56; H01L 21/76802; H01L 23/3128
See application file for complete search history.

(56) References Cited

U.S. PATENT DOCUMENTS

| | | | |
|---|---|---|---|
| 9,633,924 B1* | 4/2017 | Yu | H01L 21/76834 |
| 11,302,672 B2* | 4/2022 | Campos | H01L 24/81 |
| 2011/0149493 A1* | 6/2011 | Kwon | H01L 24/49 |
| | | | 361/783 |
| 2012/0286432 A1* | 11/2012 | Do | H01L 23/5385 |
| | | | 257/777 |
| 2013/0082383 A1* | 4/2013 | Aoya | H01L 25/0657 |
| | | | 438/118 |
| 2013/0171752 A1* | 7/2013 | Val | H01L 24/24 |
| | | | 438/15 |
| 2013/0200528 A1* | 8/2013 | Lin | H01L 24/97 |
| | | | 257/774 |
| 2013/0320471 A1* | 12/2013 | Luan | H01L 27/14625 |
| | | | 257/E31.127 |

(Continued)

FOREIGN PATENT DOCUMENTS

DE 10 2011 007 537 A1 10/2012

*Primary Examiner* — Laura M Menz
(74) *Attorney, Agent, or Firm* — Seed IP Law Group LLP

(57) ABSTRACT

The disclosure concerns an electronic device and methods of making an electronic device. The electronic device includes a circuit that is at least partially formed in an active region of a substrate. An electronic package is stacked on the substrate. A via extends through the circuit from the active region of the substrate to a surface of the substrate that is opposite the active region. At least one contacting element connects the via to the electronic package.

18 Claims, 3 Drawing Sheets

(56) References Cited

U.S. PATENT DOCUMENTS

| | | | |
|---|---|---|---|
| 2015/0348928 A1* | 12/2015 | Co | H01L 23/49833 |
| | | | 438/126 |
| 2016/0358893 A1* | 12/2016 | Kwon | H01L 25/18 |
| 2017/0033462 A1* | 2/2017 | Clemente | H01Q 1/48 |
| 2018/0061810 A1* | 3/2018 | Lin | H01L 23/5385 |
| 2018/0277495 A1* | 9/2018 | Chiu | H01L 24/16 |
| 2018/0342433 A1 | 11/2018 | Ziglioli et al. | |
| 2019/0164941 A1* | 5/2019 | Wu | H01L 23/5384 |
| 2020/0303348 A1* | 9/2020 | Campos | H01L 25/0657 |
| 2021/0233848 A1* | 7/2021 | Chung | H01L 23/552 |
| 2022/0238492 A1* | 7/2022 | Campos | H01L 25/105 |
| 2024/0088019 A1* | 3/2024 | Lee | H01L 21/76831 |

* cited by examiner

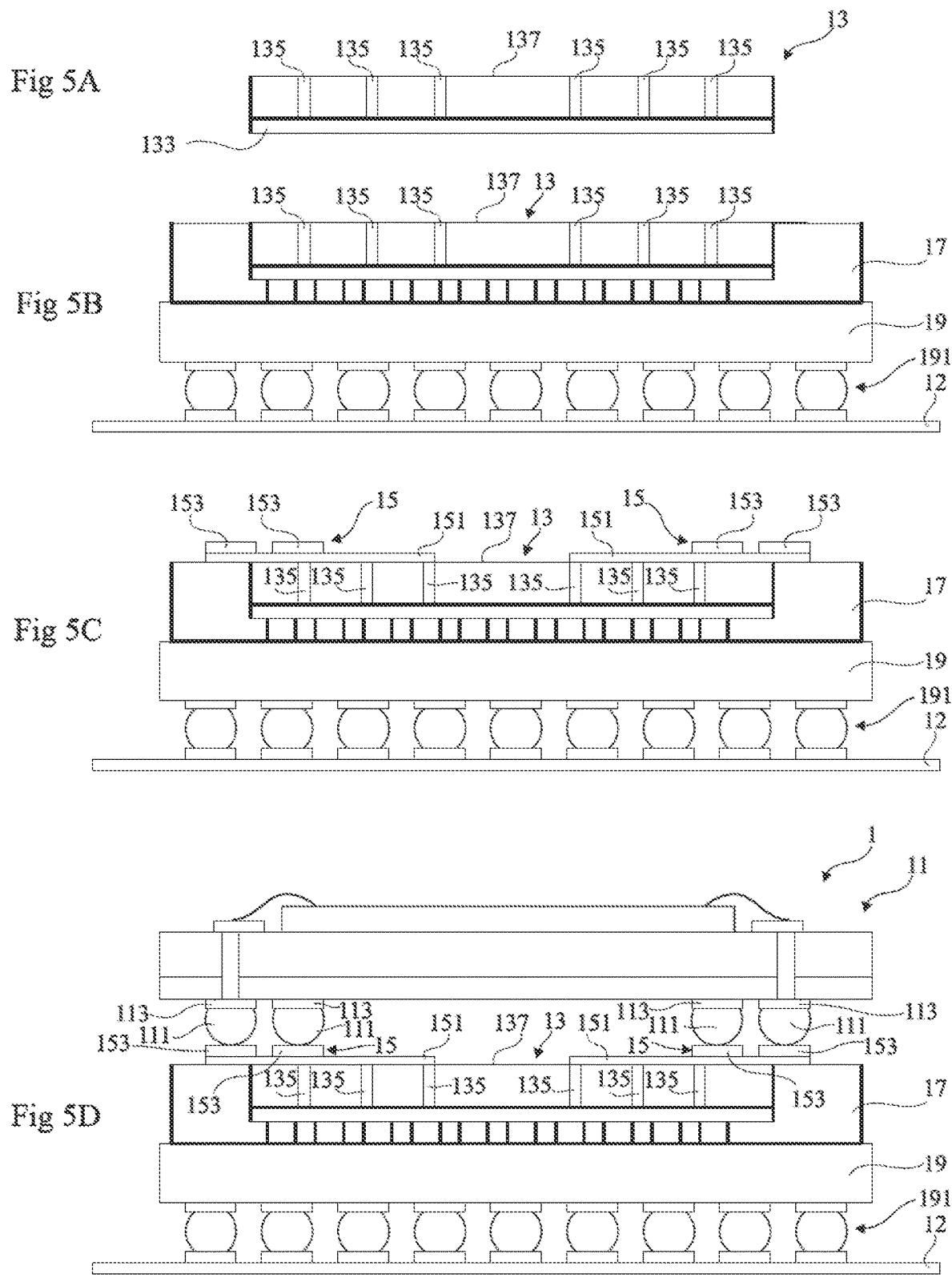

INTERCONNECTED STACKED CIRCUITS

BACKGROUND

Technical Field

The present disclosure generally relates to electronic devices and, more particularly, to devices where a plurality of circuits are stacked and interconnected.

Description of the Related Art

There already exist devices formed of a plurality of circuits arranged on one another (Package on Package—PoP) and connected to one another. Such circuits are typically assembled on supports comprising a ball grid array (BGA).

BRIEF SUMMARY

There is a need to decrease the length of connections between stacked circuits.

The present disclosure provides various embodiments which overcomes all or part of the disadvantages of known connection devices and methods.

An embodiment provides an electronic device comprising:
 at least one circuit;
 at least one via, passing through said circuit; and
 at least one contacting element, connecting said via to an electronic package stacked to said circuit.

An embodiment provides an electronic device manufacturing method, comprising the steps of:
 forming, in at least one circuit, at least one via passing through said circuit; and
 forming at least one contacting element connecting said via to an electronic package stacked to said circuit.

According to an embodiment, said contacting element is formed of:
 at least one conductive track; and/or
 at least one conductive pad.

According to an embodiment, the electronic package, stacked to said circuit, comprises at least one solder bump.

According to an embodiment, said circuit is assembled on a support comprising an array of solder bumps.

According to an embodiment, said circuit is a microprocessor, a microcontroller, or an integrated system.

According to an embodiment, the electronic package, stacked to said circuit, contains at least one memory circuit.

According to an embodiment, said contacting element is arranged on the back side of said circuit.

According to an embodiment, said circuit is partially surrounded with an encapsulation block, the back side of said circuit remaining at least partially accessible.

According to an embodiment, said contacting element is arranged at the surface of the encapsulation block and on the back side of said circuit.

According to an embodiment, the encapsulation block is formed of a plastic material containing additive particles capable of being activated by a laser radiation.

According to an embodiment, said contacting element is attached or anchored to areas, at the surface of the encapsulation block, where the additive particles, contained in the plastic material forming the encapsulation block, have been previously activated by a laser direct structuring technology.

According to an embodiment, said contacting element is at least partially obtained by at least one chemical deposition in a metal bath.

The foregoing and other features and advantages will be discussed in detail in the following non-limiting description of specific embodiments in connection with the accompanying drawings.

BRIEF DESCRIPTION OF THE DRAWINGS

FIGS. 5A through 5D schematically and partially shows, in cross-section views, an embodiment of a method of manufacturing an electronic device comprising an electronic package connected to a circuit.

DETAILED DESCRIPTION

Figure 1:
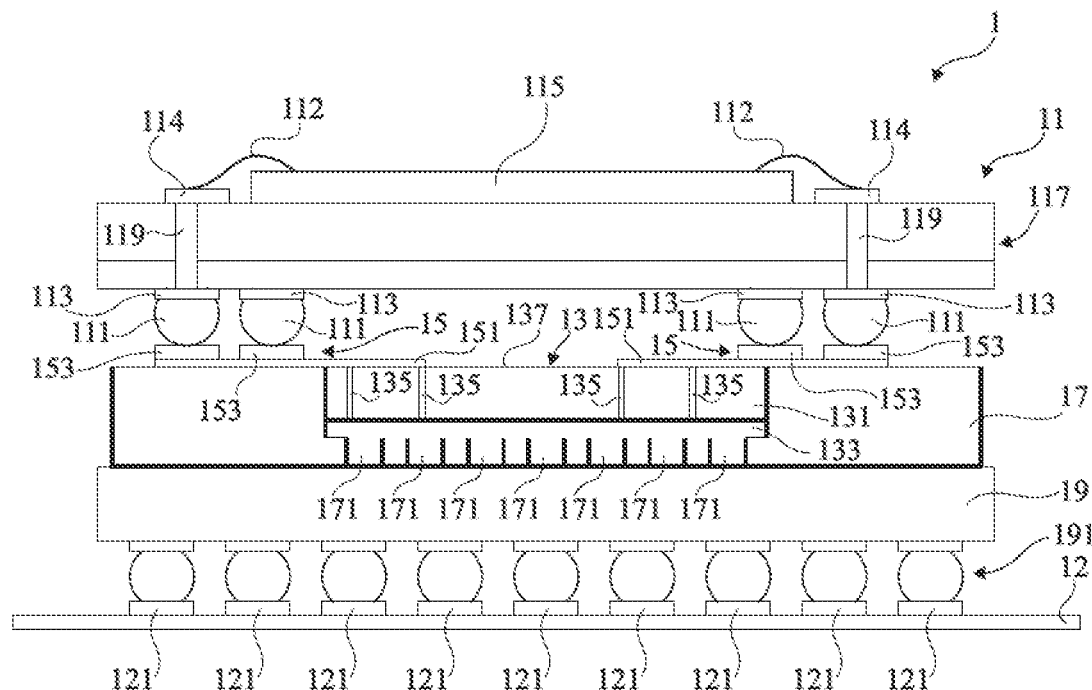
FIG. 1 shows a partial simplified cross-section view of an embodiment of an electronic device comprising an electronic package connected to a circuit.

The same elements have been designated with the same reference numerals in the different drawings. In particular, the structural and/or functional elements common to the different embodiments and implementation modes may be designated with the same reference numerals and may have identical structural, dimensional, and material properties.

For clarity, only those steps and elements which are useful to the understanding of the embodiments and of the implementation modes which will be described have been shown and are detailed. In particular, the forming of the electronic package stacked to the circuit and the manufacturing of the plastic material containing the additive particles capable of being activated by a laser radiation have not been detailed.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "approximately", "substantially", and "in the order of" are used herein to designate a tolerance of plus or minus 10%, preferably of plus or minus 5%, of the value in question.

FIG. 1 shows a partial simplified cross-section view of an embodiment of an electronic device comprising an electronic package connected to a circuit.

According to this embodiment, an electronic device 1 comprises an electronic package 11 stacked to a circuit 13. Circuit 13 is typically formed of a substrate 131, preferably made of silicon, integrating an active region or active portion 133. Conductive vias 135 (Through-Silicon Vias—TSV) thoroughly cross the thickness of circuit 13 (substrate 131). Contacting elements 15 are connected to these vias 135 on back side 137 (upper surface in FIG. 1).

According to a preferred embodiment, circuit 13 is a microprocessor, a microcontroller, or an integrated system (System on a Chip—SoC).

According to another embodiment, active portion 133 of circuit 13 comprises a planar winding forming an antenna or an inductance.

In the example of FIG. 1, contacting elements 15 are arranged both on back side 137 of circuit 13 and at the surface of an encapsulation block 17 of circuit 13. Block 17 partially encapsulates circuit 13 (on five sides, three in the cross-section view) so that back side 137 of circuit 13 remains at least partially accessible or exposed.

According to a preferred embodiment, each contacting element 15 is formed of:
- a conductive track 151 (redistribution layer—RDL) contacting via 135, the track being mainly made of copper; and
- a conductive pad 153 (pad) contacting track 151, the pad being mainly made of copper and of an alloy of nickel and of gold.

According to this preferred embodiment, an electric contact is established between each connection pad 153 and electronic package 11. The electric contact is typically obtained via a solder bump 111 interposed between connection pad 153 and a pad 113 of electronic package 11, preferably on the back side of package 11.

In the example of FIG. 1, a chip 115 or electronic circuit (preferably, a memory circuit) is arranged or assembled on an insulating support 117 or substrate. Support 117 is typically crossed by conductive vias 119 (substrate vias). A connection, formed by conductive wires 112 (wire bonding), enables to couple pads formed on the front side of chip 115 to pads 114 arranged on an upper surface of support 117, outside of chip 115.

In other words, circuit 13 is connected to chip 115 of electronic package 11 via:
- vias 135;
- contacting elements 15 each formed of conductive track 151 and of connection pad 153;
- solder bumps 111;
- pads 113 of electronic package 11;
- vias 119 crossing support 117 of electronic package 11;
- pads 114 arranged at the surface of support 117; and
- conductive wires 112.

According to a preferred embodiment, circuit 13 is arranged or assembled on an interconnection wafer 19 or support. Interconnection wafer 19 supports, on one surface, a ball grid array 191 (BGA). Ball grid array 191 is capable of coupling, via tracks and vias of wafer 19 typically comprising a plurality of conductive levels, the pads of circuit 13 to pads 121 of a support 12 (for example, a wafer or an electronic board, for example, a printed circuit board (PCB).

In the example of FIG. 1, encapsulation block 17, interposed between circuit 13 and wafer 19, comprises inserts 171. Inserts 171, which are optional, typically take part, in addition to the electric connection of circuit 13 to wafer 19, in a dissipation of thermal power generated by circuit 13. Inserts 171 are preferably made of copper (copper pillars). As a variation, inserts 171 are replaced with an array of solder bumps or ball grid array.

According to a preferred embodiment, encapsulation block 17 is formed of a plastic material or resin containing additive particles, where a laser direct structuring (LDS) technology may be implemented.

Vias 135, associated with contacting elements 15, provide device 1 with a plurality of advantages. On the one hand, device 1 has an increased electric performance (decreased parasitic inductances), resulting from a short electric connection length between circuit 13 and chip 115 of electronic package 11 with respect to a usual stacked assembly. Indeed, in a usual stack, the connections between circuit 13 and circuit 115 transit through wafer 12 and then rise through wafer 19, encapsulation block 17, and package 11. On the other hand, device 1 is simple to form due to the absence of vias (TMV) in encapsulation block 17 of circuit 13. Further, a better heat dissipation of circuit 13 is obtained due to the fact that vias 135 and elements 15 are mainly made of copper, which is a good heat conductor. Such a heat dissipation is further improved by the fact that back side 137 of circuit 13 is separated from electronic package 11 by an air layer determined by a thickness provided by solder bumps 111.

The embodiment illustrated in FIG. 1 typically enables to stack, above circuit 13, an electronic package 11 having dimensions (length and width) greater than those of circuit 13.

According to an embodiment, circuit 13, for example, has a width and a length both in the range from 3 mm to 8 mm. Electronic package 11, for example, has a length and a width both approximately equal to from 12 to 15 mm. Device 1 has a total thickness (outside of support 12), for example, in the range from approximately 2 mm to 3 mm.

Figure 2:
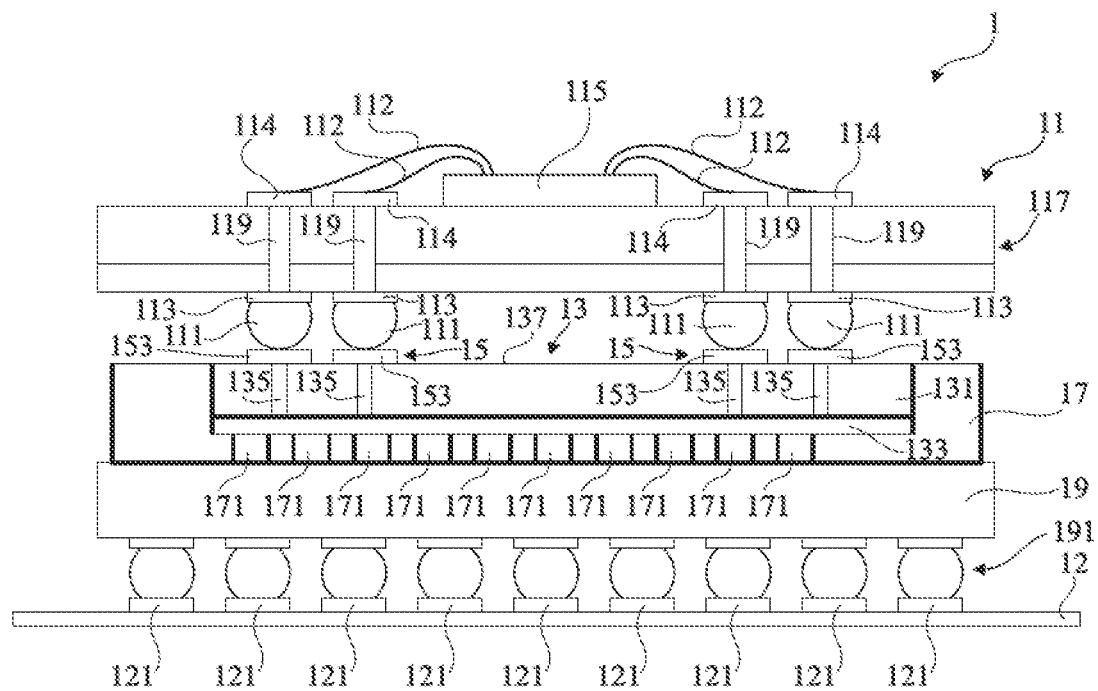
FIG. 2 shows a partial simplified cross-section view of another embodiment of an electronic device comprising an electronic package connected to a circuit.

FIG. 2 shows a partial simplified cross-section view of another embodiment of an electronic device comprising an electronic package connected to a circuit.

This embodiment typically corresponds to a configuration where chip 115 of package 11 has dimensions (length and width) smaller than those of circuit 13. Pads 113, located on the back side of package 11, and solder bumps 111 are then located above and in line with circuit 13. In such a configuration, pads 153 are not transferred to the surface of encapsulation blocks 17 to come into contact with pads 113 of package 11.

In the example of FIG. 2, pads 153 are directly arranged or deposited on back side 137 of circuit 13. Each pad 153 enables to contact a via 135 to a solder bump 111 of electronic package 11. In such a configuration, conductive tracks 151 (FIG. 1) are no longer useful to connect package 11 to circuit 13. In this case, contacting elements 15 are limited to pads 153. Each contacting element 15 is thus only formed of pad 153.

According to an embodiment, conductive vias 135, crossing circuit 13, are designed and formed according to the position of pads 113 of electronic package 11. Each via 135 is, preferably, approximately positioned vertically in line with the pad 113 of electronic package 11, stacked to circuit 13, that it is intended to contact.

In the example of FIG. 2, encapsulation block 17 of circuit 13 comprises no conductive track at its upper surface. The material forming encapsulation block 17 is then generally deprived of the additive particles on which the LDS technology can be implemented.

Figure 3:
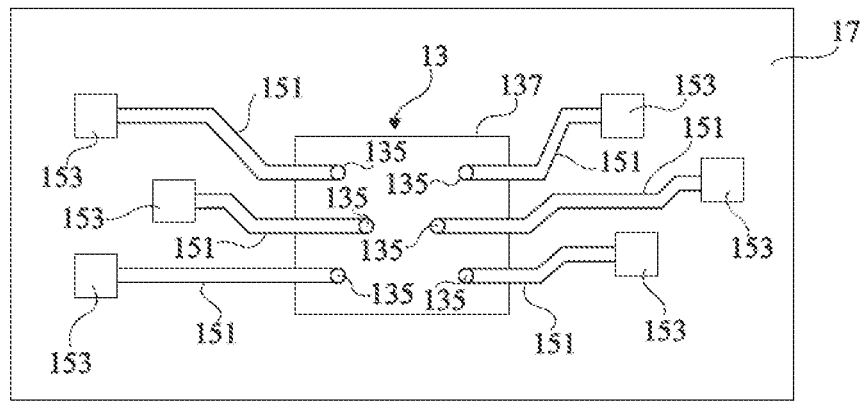
FIG. 3 shows a partial simplified top view of an embodiment of a circuit of an electronic device.

FIG. 3 shows a partial simplified top view of an embodiment of a circuit of an electronic device.

This embodiment corresponds to a forming similar to that of FIG. 1, that is, typically to a configuration where chip 115 (not shown) has dimensions (length and width) greater than those of circuit 13. Contacting elements 15 are then formed of conductive tracks 151 and of connection pads 153. This thus enables to transfer pads 153 to the surface of encapsulation block 17 of device 13 to contact pads 113 of electronic package 11 (not shown) stacked to circuit 13.

According to this embodiment, conductive tracks 151 contact vias 135 which cross circuit 13. Conductive tracks 151 are thus arranged, etched, attached or anchored:
- to back side 137 of device 13; and
- at the surface of encapsulation block 17.

According to a preferred embodiment, each pad 153 located at the surface of encapsulation block 17 is approximately positioned vertically in line with the pad 113 of electronic package 11 (not shown), stacked to circuit 13, that it is intended to contact.

Figure 4:
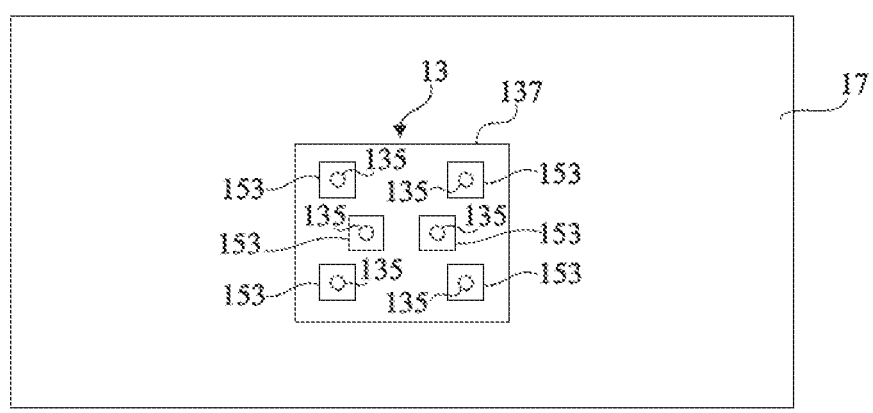
FIG. 4 shows a partial simplified top view of another embodiment of a circuit of an electronic device.

FIG. 4 shows a partial simplified top view of another embodiment of a circuit of an electronic device.

This embodiment corresponds to a forming similar to that of FIG. 2, that is, typically to a configuration where chip 115 (not shown) has dimensions (length and width) smaller than those of circuit 13. Contacting elements 15 are then only formed of connection pads 153.

According to this embodiment, pads 153 will directly contact vias 135 crossing circuit 13. Pads 153 are then arranged, etched, attached, or anchored to the back side 137 of device 13.

According to a preferred embodiment, each pad 153 on back side 137 of circuit 13 is, preferably, approximately positioned vertically in line with the pad 113 of electronic package 11 (not shown) stacked to circuit 13, that it is intended to contact.

FIG. 5 schematically and partially shows in cross-section views (A), (B), (C), (D) an embodiment of a method of manufacturing an electronic device comprising an electronic package connected to a circuit of the type of that illustrated in FIG. 1.

According to this embodiment, it is provided to first form circuit 13 comprising an active portion 133, and conductive vias 135 which emerge onto back side 137 of circuit 13 (FIG. 5, view A).

Circuit 13 is then arranged or assembled on interconnection wafer 19. Interconnection wafer 19 comprises ball grid array 191 enabling to connect pads arranged on the back side of wafer 19 to support 12. Then, an encapsulation block 17 of circuit 13 is formed (FIG. 5, view B). Block 17 partially encapsulates device 13 (on five surfaces, three on the cross-section view). Back side 137 of device 13 is thus left free to enable to subsequently form contacting elements 15.

According to a preferred embodiment, encapsulation block 17 is typically obtained by overmolding of a plastic material, preferably a thermosetting resin (for example, an epoxy resin), injected in the liquid state into a mold. The plastic material contains additive particles, non-conductive for electricity, on which the laser direct structuring (LDS) technology may be implemented. The additive particles are suspended or dispersed in the liquid plastic material. After the molding, block 17 is then made of a solid plastic material including the additive particles.

Contacting elements 15 are then formed (FIG. 5, view C). Each contacting element 15 is formed of conductive track 151 and of connection pad 153. Conductive track 151 is capable of transferring pad 153 to subsequently contact pads 113 of device 11, stacked to circuit 13.

In the example of FIG. 5, each track 151 is formed of two portions:
- a portion located on back side 137 of circuit 13; and
- another portion located at the surface of encapsulation block 17 of circuit 13.

According to an embodiment, the portion of track 151 located on back side 137 of circuit 13 is obtained by etching of a metal layer covering back side 137.

According to a preferred embodiment, the portion of track 151 located at the surface of encapsulation block 17 of circuit 13 is formed by using the laser direct structuring (LDS) technology. The additive particles, located at the surface of block 17, are first locally activated, under the effect of a laser radiation, on areas where portions of conductive tracks 151 are desired or selected to be formed. The surface of block 17, comprising the particles thus activated, is then placed in contact with a metal bath. The metal of the bath then catches or anchors to the additive particles activated at the surface of encapsulation block 17 of circuit 13. The portion of track 151 located at the surface of block 17 is then obtained.

Finally, electronic package 11 is assembled above circuit 13 (FIG. 5, view D). Pads 113 located on the back side of package 11 are placed vertically in line with pads 153 of contacting elements 15. A solder bump 111 then enables to attach and to electrically contact each pad 113 of package 11 to the pad 153 located opposite thereto.

Various embodiments, implementation modes, and variations have been described. It will be understood by those skilled in the art that certain features of these various embodiments, implementation modes, and variations may be combined, and other variations will occur to those skilled in the art. In particular, the circuit is capable of being connected to the stacked package by a combination of contacting elements, certain elements being formed of conductive tracks and of pads and of other elements only comprising pads.

Finally, the practical implementation of the described embodiments, implementation modes, and variations is within the abilities of those skilled in the art based on the functional indications given hereabove.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device, comprising:
   a substrate;
   a circuit at least partially formed in an active region of the substrate;
   an encapsulation block partially encapsulating the circuit, wherein the encapsulation block is formed of a plastic material containing additive particles activatable by a laser radiation;
   an electronic package stacked on the substrate;
   a via extending through said circuit from the active region of the substrate to a surface of the substrate opposite the active region; and
   a contacting element connecting said via to the electronic package.

2. The electronic device of claim 1, wherein said contacting element includes at least one of: a conductive track or a conductive pad.

3. The device of claim 1, wherein the electronic package includes at least one solder bump.

4. The device of claim 1, wherein said circuit is arranged on a support including an array of solder bumps.

5. The device of claim 1, wherein said circuit is a microprocessor, a microcontroller, or an integrated system.

6. The device of claim 1, wherein the electronic package includes at least one memory circuit.

7. The device of claim 1, wherein said contacting element is arranged on the surface of the substrate.

8. The device of claim 1, wherein the encapsulation block is at least partially surrounding the substrate, the surface of the substrate being at least partially uncovered by the encapsulation block.

9. The device of claim 8, wherein said contacting element is arranged on a surface of the encapsulation block and on the surface of the substrate.

10. The device of claim 1, wherein said contacting element is attached or anchored to areas, at a surface of the encapsulation block, where the additive particles, contained in the plastic material forming the encapsulation block, have been previously activated by a laser structuring technology.

11. The device of claim 1, wherein said contacting element is at least partially formed by at least one chemical deposition in a metal bath.

12. An electronic device, comprising:
a substrate;
a circuit at least partially formed in an active region of the substrate;
an encapsulation layer at least partially surrounding the substrate, wherein the encapsulation layer includes a plastic material containing additive particles activatable by a laser radiation;
an electronic package on the substrate;
a via extending through the circuit from the active region of the substrate to a surface of the substrate opposite the active region; and
a contacting element connecting the via to the electronic package.

13. The device of claim 12, wherein the electronic package includes at least one memory circuit.

14. An electronic device, comprising:
a substrate;
a circuit in an active portion of the substrate;
an electronic package stacked on the substrate;
a plurality of conductive vias formed across the circuit and the substrate;
contacting elements having a plurality of first conductive pads coupled to the plurality of conductive vias and arranged on an encapsulation layer, wherein the encapsulation layer includes a plastic material containing additive particles activatable by a laser radiation; and
a plurality of solder bumps interposed between the plurality of first conductive pads and a plurality of second conductive pads, wherein the circuit is connected to the electronic package via the plurality of solder bumps.

15. The electronic device of 14, wherein a first side of the circuit is partially exposed.

16. The electronic device of 14, wherein the contacting elements further comprise a conductive track at least partially arranged on the encapsulation layer.

17. The electronic device of 14, further comprising a wafer having a first surface and a second surface opposite the first surface, wherein the first surface comprises a ball grid array.

18. The electronic device of 14, wherein the electronic package comprises a chip having a first dimension and a second dimension, the first and second dimensions of the chip smaller than a first dimension and a second dimension of the circuit.

* * * * *

UNITED STATES PATENT AND TRADEMARK OFFICE
CERTIFICATE OF CORRECTION

PATENT NO. : 12,308,347 B2
APPLICATION NO. : 17/718145
DATED : May 20, 2025
INVENTOR(S) : Didier Campos Page 1 of 1

It is certified that error appears in the above-identified patent and that said Letters Patent is hereby corrected as shown below:

In the Claims

Column 8, Claim 15, Line 23:
"device of 14," should read: -- device of claim 14, --.

Column 8, Claim 16, Line 25:
"device of 14," should read: -- device of claim 14, --.

Column 8, Claim 17, Line 28:
"device of 14," should read: -- device of claim 14, --.

Column 8, Claim 18, Line 32:
"device of 14," should read: -- device of claim 14, --.

Signed and Sealed this
Twenty-second Day of July, 2025

Coke Morgan Stewart
*Acting Director of the United States Patent and Trademark Office*